United States Patent [19]

Nomura et al.

[11] Patent Number: 4,622,613

[45] Date of Patent: Nov. 11, 1986

[54] THIN FILM MAGNETIC HEAD

[75] Inventors: Noboru Nomura, Kyoto; Kenji Kanai, Kumamoto; Nobuyuki Kaminaka, Osaka, all of Japan

[73] Assignee: Matsushita Electric Industrials Co., Ltd., Osaka, Japan

[21] Appl. No.: 540,154

[22] Filed: Oct. 7, 1983

[51] Int. Cl.[4] .......................... G11B 5/12; G11B 5/30
[52] U.S. Cl. .................................................. 360/113
[58] Field of Search ...................... 360/113, 60, 125

[56] References Cited

U.S. PATENT DOCUMENTS 4,034,414  7/1977  Kaminaka et al. ................ 360/113

FOREIGN PATENT DOCUMENTS 52-67608   6/1977  Japan ................................. 360/113
55-150116 11/1980  Japan ................................. 360/113
57-74820  11/1982  Japan ................................. 360/113

Primary Examiner—John H. Wolff
Attorney, Agent, or Firm—Burgess, Ryan & Wayne

[57] ABSTRACT

In a magnetoresistive (MR) effect head, electrodes for supplying a current to an MR element and a bias current conductor are not exposed at a contact surface of the MR head which is brought into sliding contact with a magnetic recording medium, thus preventing surface roughening of the contact surface.

8 Claims, 13 Drawing Figures

FIG. 7
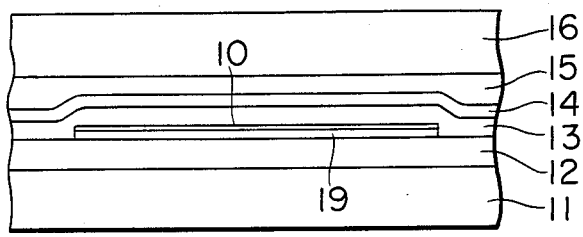
FIG. 8A   FIG. 8B
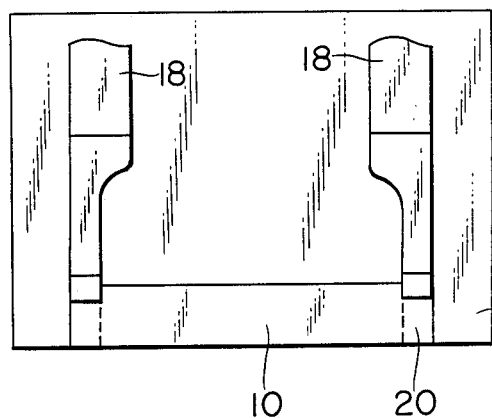 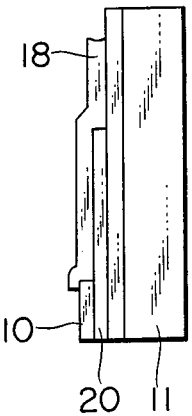
FIG. 9
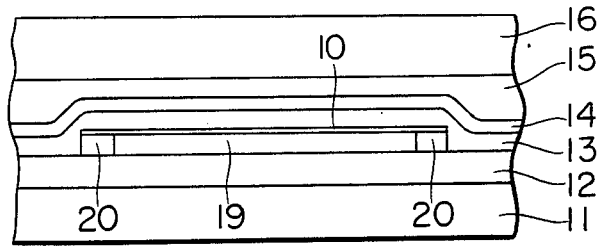

THIN FILM MAGNETIC HEAD

BACKGROUND OF THE INVENTION

The present invention relates to a thin film magnetic head (to be referred to as an MR head) having a magnetoresistive effect element (to be referred to as an MR element hereinafter).

In a conventional MR head using an MR element, the distal end of an electrode for supplying a current to the MR element and a bias current conductor are exposed at a surface of the MR head which contacts a magnetic recording medium. Surface roughening occurs at a portion of the electrode which is located at the contact surface. This surface roughening is also effected in the vicinity of a magnetic substrate, a nonmagnetic insulating layer, the MR element, and a magnetic shield film. As a result, the conventional MR head cannot be effectively used in practice.

SUMMARY OF THE INVENTION

It is an object of the present invention to provide an MR head which has a long service life and good wear resistance.

It is another object of the present invention to provide an MR head which has a proper resistivity as a magnetic head.

According to the MR head of the present invention, an electrode for supplying a current to an MR element and a bias current conductor are not exposed at a surface of the MR head which contacts a magnetic recording medium, thereby preventing the tip of the electrode from contacting the magnetic recording medium and hence from being subjected to surface roughening.

Other objects, features and advantages of the present invention will be apparent from the following detailed description taken in conjunction with the accompanying drawings.

BRIEF DESCRIPTION OF THE DRAWINGS

FIGS. 4A, 6A and 8A are plan views of MR heads according to embodiments of the present invention, and FIGS. 4B, 6B and 8B are side views thereof, respectively;

FIG. 7 shows a medium contact surface of the MR head shown in FIG. 6A; and

FIG. 9 shows a medium contact surface of the MR head shown in FIG. 8A.

CONCRETE DESCRIPTION OF PRIOR ART

Figure 1:
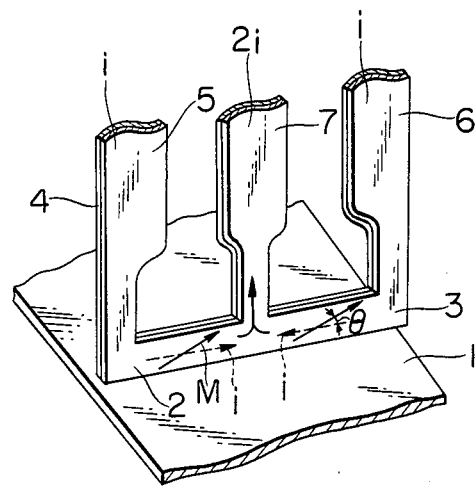
FIGS. 1 and 2 show conventional MR heads, respectively.
Figure 2:
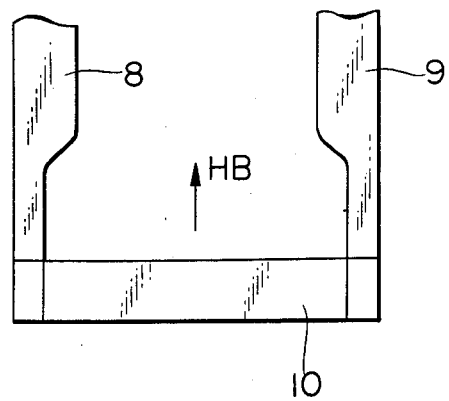

FIGS. 1 and 2 show conventional MR heads, respectively. In the MR head (FIG. 1) having a single magnetic domain configuration, a magnetization M is rotated by a signal magnetic field generated from a magnetic recording medium 1 and has an angle $\theta$ with respect to a current i flowing through MR elements 2 and 3. It is conventionally considered that change in resistivity $\Delta \rho$ is proportional to $\cos^2\theta$. In order to obtain good linearity, a bias magnetic field is generated by a current supplied to a bias current conductor 4. Electrodes 5 and 6 supply a current to the MR elements 2 and 3 and the bias current conductor 4 so as to flow a current through a command electrode 7.

In this MR head, the MR elements 2 and 3 extend to the electrodes 5, 6 and 7. The magnetic domains of the MR element portions in practical operation do not exhibit a single magnetic domain configuration, and the utilization efficiency of the MR characteristics is degraded below that required for industrial applications. Moreover, in the electrode configuration in FIG. 1, a combined resistivity of the MR elements and the bias current conductor 4 for generating the bias magnetic field is increased since the bias current conductor 4 is made of Ti having a resistivity of 100 $\mu\Omega$ cm although the MR elements are made of an Ni-Fe alloy (83:17) having a resistivity of 30 $\mu\Omega$ cm. Therefore, when a plurality of elements are used to constitute a magnetic head, heat dissipated upon application of a current cannot be neglected. Thus, the magnetic head of this type cannot be used in practice.

FIG. 2 shows another example of a conventional MR element. Two electrodes 8 and 9 are disposed at the two ends of a single MR element 10. A current flows from one of the electrodes, and a change in resistivity of the MR element 10 is detected as a change in voltage. A bias magnetic field $H_B$ is applied to the MR element 10 such that the secondary harmonic distortion of a reproduction output from the MR element 10 is minimized. The electrodes comprise a two-layer (Au and Cr) structure or a thin lower-resistivity metal film such as an Al film. This conventional MR head dissipates little heat and can be easily used.

Figure 3A:
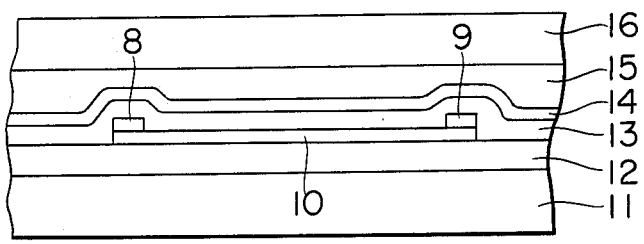
FIGS. 3A and 3B show a recording medium contact surface of the MR head (FIG. 2) and the same medium contact surface after a life test is performed, respectively.

When the magnetic head having the construction shown in FIG. 2 is used in practice, the front surface of the head having a structure as shown in FIG. 3A is brought into sliding contact with the magnetic recording medium. Referring to FIG. 3A, an insulating layer 12 is formed on a magnetic substrate 11. An Fe-Ni alloy for providing an MR element 10 is deposited on the insulating layer 12. Electrodes 8 and 9 are disposed at the two ends of the MR element. An insulating layer 13 is deposited on the MR element and the electrodes and a magnetic shield layer 14 is formed on the insulating layer 13. A protective substrate 16 made of glass or the like is formed on the magnetic shield layer 14 through an adhesive layer 15 to protect the MR head. The front surface of the resultant structure is polished to form a tape contact surface, thereby providing a tape head.

Figure 3B:
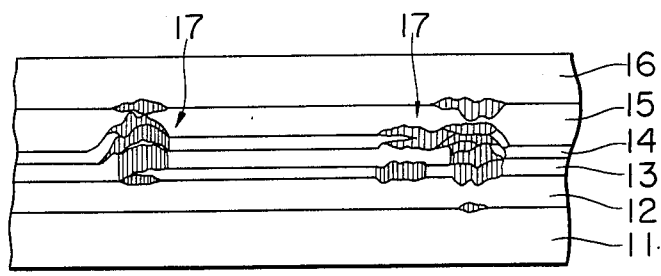

On the front surface of the magnetic head having the construction described above, when the magnetic recording medium is brought into sliding contact with the tape contact surface of the magnetic head, roughened portions 17 are formed starting in the vicinity of the electrodes 8 and 9 and extending to the magnetic substrate 11, the nonmagnetic insulating layers 12 and 13, the MR element 10 and the magnetic shield layer 14, as shown in FIG. 3B. As a result, this magnetic head is not suitable for practical industrial applications.

DESCRIPTION OF THE PREFERRED EMBODIMENTS

Figures 4A, 4B:
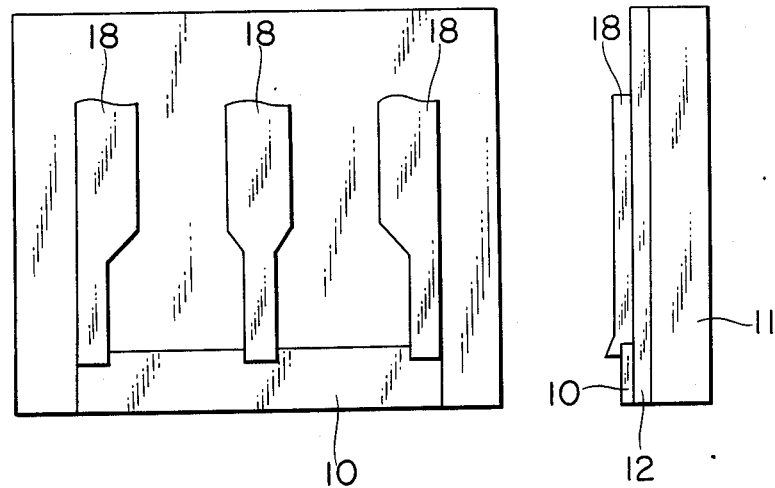
Figure 5:
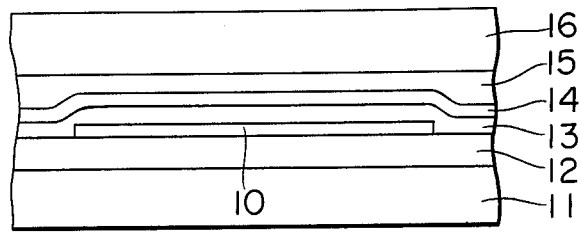
FIG. 5 shows a medium contact surface of the MR head shown in FIG. 4A.

FIGS. 4A and 4B show an MR head according to a first embodiment of the present invention, and FIG. 5 shows a head front surface thereof. The same reference numerals as used in FIGS. 3A and 3B denote the same parts in FIGS. 4A, 4B and 5, and a detailed description thereof will be omitted. The MR element 10 is formed in a strip shape. Electrodes 18 electrically and physically contact with parts of the MR element 10 respectively, and extend to couple to an external circuit.

FIG. 5 shows a contact surface of the MR head which is brought into sliding contact with the magnetic recording medium. An insulating layer as a magnetic gap 13 is formed on the multilayer structure shown in FIG. 5, and a magnetic shield film 14 is deposited on the magnetic gap 13. A protective glass body 16 is formed on the magnetic shield film 14 through an adhesive layer 15. Electrode materials Au/Cr, Al, Cu, Ag and so on are not exposed at the front surface of the head. The MR element comprises an Fe-Ni alloy or a Co-Ni alloy and has a Mohs hardness of 5 As a result, the head wear and chipping shown in FIG. 3B do not occur. In addition to this advantage, the MR element directly contacts the electrodes, so that a combined resistance is very low, thus providing a practical advantage. However, since the contact portion between the MR element and the electrodes is small, alignment of a resist pattern to the MR element is difficult to achieve, and the resist film at the time of contact exposure tends to be damaged by the sliding contact with the photomask.

Figure 6A:
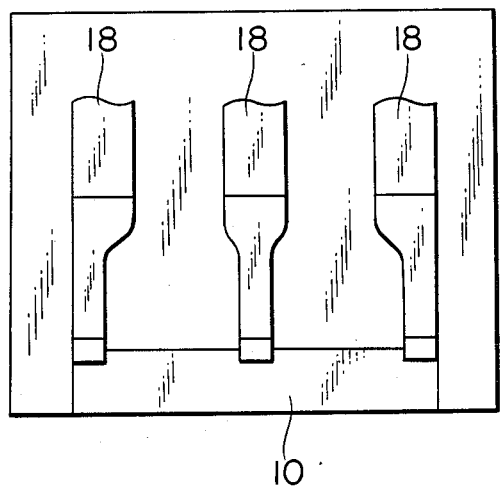
Figure 6B:
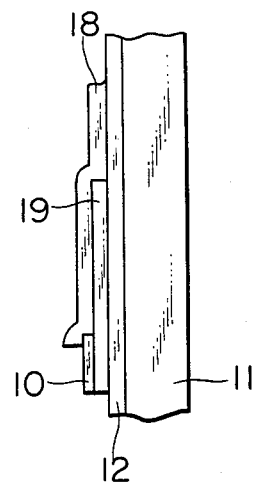

For improving reliability of electrical contact between the MR element and the electrodes, FIGS. 6A and 6B show an MR head according to a second embodiment of the present invention. Metal conductor layers 19 are formed on one of the major surfaces of an MR element 10 and serve as a base. As shown in FIG. 6A, the MR element 10 is formed in a strip shape. The metal conductor layers 19 extend from behind the MR element such that these metal layers overlap electrodes 18, respectively. Each electrode 18 is formed to cover a portion of the MR element 10 and the corresponding conductor layer 19. Each electrode 18 extends toward the rear side of the magnetic substrate 11 as compared with the corresponding metal conductor layer 19.

FIG. 7 shows a recording medium contact surface of the MR head shown in FIG. 6. The contact surface shown in FIG. 7 is substantially the same as that shown in FIG. 3A except that the metal conductor layers 19 are formed below the MR element and the electrodes 18 are not exposed at the front surface of the head. The metal conductor layers 19 cause the MR element to sufficiently electrically contact the electrodes 18. In this sense, a resistivity of the metal conductor layer itself does not substantially cause heat dissipation of the head as a contact area.

In general, metals used as electrodes are good conductors, i.e., copper, silver and gold of Group Ib, and aluminium of Group IIIb. The resistivities of these metals are not more than 3 $\mu\Omega$ cm. Tables 1 and 2 show the relationships between the elements and their Mohs hardness values and between the elements and their resistivities, respectively. The elements excluding the elements of Groups Ib and IIb and boron of Group IIIb have a low hardness value of 3 or less. When the metal conductor layers 19 are exposed as shown in FIG. 3A, a gap deterioration occurs, as shown in FIG. 3B.

The Mohs hardness values of elements of Groups IIIa, IVa, Va, VIa, VIIa and VIII fall within the range between 4 and 9, and are higher than that of any other good conductor, providing good wear resistance, and these wear resistance conductors are used for a biasing conductors in this embodiment.

TABLE 1

| | Ia | IIa | IIIa | IVa | Va | VIa | VIIa | VIII | | | Ib | IIb | IIIb | IVb | Vb | VIb | VIIb |
|---|---|---|---|---|---|---|---|---|---|---|---|---|---|---|---|---|---|
| | | | | | | | | Mohs Hardness | | | | | | | | | |
| 2 | Li | Be | | | | | | | | | | | B | C | N | O | F |
| | 0 | 6 | | | | | | | | | | | 9 | 10 | | | |
| 3 | Na | Mg | | | | | | | | | | | Al | Si | P | S | Cl |
| | 0 | 2 | | | | | | | | | | | 2 | 7 | 0 | | |
| 4 | K | Ca | Sc | Ti | V | Cr | Mn | Fe | Co | Ni | Cu | Zn | Ga | Ge | As | Se | Br |
| | 0 | 1 | — | 4 | — | 9 | 5 | 4 | 5 | 5 | 2 | 2 | 1 | 6 | 3 | 2 | |
| 5 | Rb | Sr | Y | Zr | Nb | Mo | Tc | Ru | Rh | Pd | Ag | Cd | In | Sn | Sb | Te | I |
| | 0 | 1 | — | — | — | — | — | 6 | — | 5 | 2 | 2 | 1 | 1 | 3 | 2 | |
| 6 | Cs | Ba | La series | Hf | Ta | W | Re | Os | Ir | Pt | Au | Hg | Tl | Pb | Bi | Po | At |
| | 0 | 2 | | — | — | 7 | — | 7 | 6 | 4 | 2 | | — | 1 | 2 | | |

| Indication | 0 | 0–0.99 | 5 | 5–5.99 |
|---|---|---|---|---|
| | 1 | 1–1.99 | 6 | 6–6.99 |
| | 2 | 2–2.99 | 7 | 7–7.99 |
| | 3 | 3–3.99 | 8 | 8–8.99 |
| | 4 | 4–4.99 | 9 | 9–9.99 |

(Good conductor; Ib Cu, Ag, Au IIIb Al)

TABLE 2

| | Ia | IIa | IIIa | IVa | Va | VIa | VIIa | VIII | | | Ib | IIb | IIIb | IVb | Vb | VIb | VIIb |
|---|---|---|---|---|---|---|---|---|---|---|---|---|---|---|---|---|---|
| | | | | | | | | Resistivity ($\mu\Omega$cm) | | | | | | | | | |
| 2 | Li | Be | | | | | | | | | | | B | C | N | O | F |
| | 8.47 | 5.5 | | | | | | | | | | | — | 1375 | | | |
| 3 | Na | Mg | | | | | | | | | | | Al | Si | P | S | Cl |
| | 4.35 | 4.0 | | | | | | | | | | | 2.5 | 10 | $10^7$ | | |
| 4 | K | Ca | Sc | Ti | V | Cr | Mn | Fe | Co | Ni | Cu | Zn | Ga | Ge | As | Se | Br |
| | 6.29 | 4.2 | 61 | 83 | 24.8–26 | 15.4 | 90.9 | 8.9 | 6.25 | 6.25 | 1.55 | 5.5 | 40.8 | 46 | 33.3 | $12^7$ | — |
| 5 | Rb | Sr | Y | Zr | Nb | Mo | Tc | Ru | Rh | Pd | Ag | Cd | In | Sn | Sb | Te | I |
| | 11.6 | 3.0 | 57 | 41.7 | 22.7 | 4.3 | — | 11.7 | 4.5 | 10 | 1.50 | 6.7 | 8.3 | 10 | 39 | $54 \times 10^5$ | $1.3 \times 10^{15}$ |
| 6 | Cs | Ba | La series | Hf | Ta | W | Re | Os | Ir | Pt | Au | Hg | Tl | Pb | Bi | Po | At |
| | 17.8 | 58.8 | | 29.4 | 13.9 | 5.0 | 18.8 | 9.1 | 5.0 | 9.8 | 2.0 | 23 | 14.1 | 19.2 | 106.8 | — | — |

Metals such as Mo, Ti and W which are relatively hard metals are suitable as metal conductors. The front surface of the MR head is made of only hard metals, thereby preventing the chipping and damage shown in FIG. 3B. The electrodes are electrically connected to the MR element through the corresponding metal conductor layers 19, so that incomplete connection between the electrodes and the MR element is eliminated. In addition to these advantages, the MR head has a sufficiently low resistance for use as a magnetic head.

FIGS. 8A and 8B show an MR head according to a third embodiment of the present invention, and FIG. 9 shows a recording medium contact surface thereof. The MR head of this embodiment is substantially the same as that of the first embodiment, except that parts 20 of a metal conductor layer 19 comprise an oxide obtained by anodic oxidation or thermal oxidation. Unlike the embodiment shown in FIG. 6, a current does not flow in both the MR element and the metal conductor layer. As a result, utilization of an electric current in the MR element can be improved. In this case, relatively hard metals such as Mo, Ti, Cr and W can be selected to form the metal conductor layers, thereby providing good wear resistance. In addition to this advantage, the MR element requires only a small current, thereby decreasing thermal noise inherent to the MR element.

What is claimed is:

1. A thin film magnetic head comprising a magnetoresistive effect element having a front tape contact edge, and at least two electrodes provided for said magnetoresistance effect element, said at least two electrodes being electrically and physically connected to said magnetoresistive effect element at a contact portion of said magnetoresistance element which is spaced rearwardly of said front contact edge of said magnetoresistive effect element such that said at least two electrodes do not extend to said front contact edge and as a consequence thereof deterioration of the electrodes is minimized.

2. A head according to claim 1, wherein said contact portion corresponds to two ends of said magnetoresistive effect element, said two ends being located at a side of said magnetoresistance effect element which opposes said front contact edge at which said thin film magnetic head contacts a magnetic recording medium.

3. A thin film magnetic head comprising a magnetoresistive effect element having a front tape contact edge, a metal conductor layer formed on at least a portion of a major surface of said magnetoresistance effect element; and an electrode electrically and physically connected to a portion of said metal conductor layer extending from said magnetoresistive effect element so as to constitute a first contact portion, and a second contact portion between said electrode and said magnetoresistive effect element being spaced rearwardly from the front contact edge of said magnetoresistance effect element, such that said electrode does not extend to said front contact edge and as a consequence thereof deterioration of the electrodes is minimized.

4. A head according to claim 3, wherein said metal conductor layer has a flat surface, and said major surface of said magnetoresistance effect element is entirely situated on said flat surface.

5. A head according to claim 4, wherein said metal conductor layer has a part which is oxidized.

6. A head according to any one of claims 3 to 5, wherein said metal conductor layer comprises at least one element selected from the group consisting of metals having a Mohs hardness value of 4 to 9.

7. A head according to any one of claims 3 to 5, wherein said metal conductor layer comprises at least one element selected from the group consisting of metals belonging to Groups IIIa, IVa, Va, VIa, VIIa and VIII of the Periodic Table.

8. A head according to any one of claims 3 to 5, wherein said metal conductor layer comprises at least one element selected from the group consisting of molybdenum, titanium and tungsten.

* * * * *